United States Patent
Lin et al.

(10) Patent No.: US 11,946,704 B2
(45) Date of Patent: Apr. 2, 2024

(54) GRAPHENE-BASED ELASTIC HEAT SPREADER FILMS

(71) Applicant: Nanotek Instruments, Inc., Dayton, OH (US)

(72) Inventors: Yi-jun Lin, Taoyuan (TW); Bor Z. Jang, Centerville, OH (US)

(73) Assignee: Global Graphene Group, Inc., Dayton, OH (US)

( * ) Notice: Subject to any disclaimer, the term of this patent is extended or adjusted under 35 U.S.C. 154(b) by 275 days.

(21) Appl. No.: 16/559,000

(22) Filed: Sep. 3, 2019

(65) Prior Publication Data

US 2021/0063098 A1    Mar. 4, 2021

(51) Int. Cl.
B32B 9/00 (2006.01)
F28F 21/02 (2006.01)
B82Y 30/00 (2011.01)

(52) U.S. Cl.
CPC .............. *F28F 21/02* (2013.01); *B82Y 30/00* (2013.01); *Y10T 428/30* (2015.01)

(58) Field of Classification Search
CPC ........ Y10T 428/30; B32B 9/007; B82Y 30/00
USPC .......................................... 428/408; 423/448
See application file for complete search history.

(56) References Cited

U.S. PATENT DOCUMENTS

| | | | |
|---|---|---|---|
| 2,798,878 A | 7/1957 | Hummers | |
| 7,071,258 B1 | 7/2006 | Jang et al. | |
| 9,233,850 B2 | 1/2016 | Jang et al. | |
| 2005/0271574 A1 | 12/2005 | Jang et al. | |
| 2008/0048152 A1 | 2/2008 | Jang et al. | |
| 2011/0200825 A1* | 8/2011 | Chakraborty | B05D 7/04 428/412 |
| 2012/0315482 A1* | 12/2012 | Muramatsu | C04B 35/62281 977/734 |

OTHER PUBLICATIONS

Anderson et al., "The Use of Esters of N-Hydroxysuccinimide in Peptide Synthesis" J. Amer. Chem. Soc. (1964) vol. 86, No. 9, pp. 1839-1842.
Hummers et al., "Preparation of graphitic oxide" J. Am. Chem. Soc. (1958) vol. 80, p. 1339.
Karlicky et al., "Halogenated Graphenes: Rapidly Growing Family of Graphene Derivatives" ACS Nano (2013) vol. 7, No. 8, pp. 6434-6464.

* cited by examiner

*Primary Examiner* — Daniel H Miller (57) ABSTRACT

Provided is a elastic heat spreader film comprising: (a) an elastomer or rubber as a binder material or a matrix material; and (b) multiple graphene sheets that are bonded by the binder material or dispersed in the matrix material, wherein the multiple graphene sheets are substantially aligned to be parallel to one another and wherein the elastomer or rubber is in an amount from 0.001% to 20% by weight based on the total heat spreader film weight; wherein the multiple graphene sheets contain single-layer or few-layer graphene sheets selected from pristine graphene, graphene oxide, reduced graphene oxide, graphene fluoride, graphene chloride, graphene bromide, graphene iodide, hydrogenated graphene, nitrogenated graphene, doped graphene, chemically functionalized graphene, or a combination thereof; and wherein the elastic heat spreader film has a fully recoverable tensile elastic strain from 2% to 100% and an in-plane thermal conductivity from 200 W/mK to 1,750 W/mK.

14 Claims, 6 Drawing Sheets

Side view of a thermal film    Side view of a thermal film bent by 180 degrees

GRAPHENE-BASED ELASTIC HEAT SPREADER FILMS

FIELD

The present disclosure relates generally to the field of thermal films or heat spreaders and, more particularly, to a graphene-based highly elastic heat spreader films and a process for producing same.

BACKGROUND

Advanced thermal management materials are becoming more and more critical for today's microelectronic, photonic, and photovoltaic systems. As new and more powerful chip designs and light-emitting diode (LED) systems are introduced, they consume more power and generate more heat. This has made thermal management a crucial issue in today's high performance systems. Systems ranging from active electronically scanned radar arrays, web servers, large battery packs for personal consumer electronics, widescreen displays, and solid-state lighting devices all require high thermal conductivity materials that can dissipate heat more efficiently. Furthermore, many microelectronic devices (e.g. smart phones, flat-screen TVs, tablets, and laptop computers) are designed and fabricated to become increasingly smaller, thinner, lighter, and tighter. This further increases the difficulty of thermal dissipation. Actually, thermal management challenges are now widely recognized as the key barriers to industry's ability to provide continued improvements in device and system performance.

Heat sinks are components that facilitate heat dissipation from the surface of a heat source, such as a CPU or battery in a computing device, to a cooler environment, such as ambient air. Typically, heat generated by a heat source must be transferred through a heat spreader to a heat sink or ambient air. A heat sink is designed to enhance the heat transfer efficiency between a heat source and the air mainly through increased heat sink surface area that is in direct contact with the air. This design enables a faster heat dissipation rate and thus lowers the device operating temperatures. In a microelectronic device, a high thermal conductivity of a heat spreader is essential to fast transfer of heat from a heat source to a heat sink or ambient air.

Graphene sheets, also referred to as nano graphene platelets (NGPs), refer to single-layer or few-layer graphene sheets selected from a pristine graphene material having essentially zero % of non-carbon elements, or a non-pristine graphene material having 0.001% to 25% by weight of non-carbon elements wherein said non-pristine graphene is selected from graphene oxide, reduced graphene oxide, graphene fluoride, graphene chloride, graphene bromide, graphene iodide, hydrogenated graphene, nitrogenated graphene, doped graphene, chemically functionalized graphene, or a combination thereof. A few-layer graphene sheet contains 2-10 graphene planes (one atom thick hexagonal planes of carbon atoms).

Heat-spreading application of graphene-based films was first developed by our research group as early as 2007: Bor Z. Jang, et al. "Nano-scaled Graphene Plate Films and Articles," U.S. patent application Ser. No. 11/784,606 (Apr. 9, 2007); now U.S. Pat. No. 9,233,850 (Jan. 12, 2016). Foldable handheld devices (e.g. foldable or bendable smart phones) are getting more and more popular. A foldable smart phone may be folded and unfolded more than 10,000 times during the useful life of this phone. Individual components, such as heat spreaders, in these devices are required to be foldable as well. However, graphene-based thermal films (or any type of thermal films) have not been known to be capable of withstanding repeated bending deformations without significantly degrading desirable properties such as thermal conductivity and structural integrity.

The present disclosure was made to overcome the limitations of prior art heat spreader films outlined above.

SUMMARY

In certain embodiments, the present disclosure provides an elastic heat spreader film comprising: (A) an elastomer or rubber as a binder material or a matrix material; and (B) multiple graphene sheets that are bonded by the binder material or dispersed in the matrix material, wherein the multiple graphene sheets are substantially aligned to be parallel to one another and wherein the elastomer or rubber is in an amount from 0.001% to 20% by weight based on the total heat spreader film weight; wherein the multiple graphene sheets contain single-layer or few-layer graphene sheets selected from a pristine graphene material having essentially zero % of non-carbon elements, or a non-pristine graphene material having 0.001% to 25% by weight of non-carbon elements wherein the non-pristine graphene is selected from graphene oxide, reduced graphene oxide, graphene fluoride, graphene chloride, graphene bromide, graphene iodide, hydrogenated graphene, nitrogenated graphene, doped graphene, chemically functionalized graphene, or a combination thereof (preferably the chemically functionalized graphene is not graphene oxide); and wherein the elastic heat spreader film has a fully recoverable tensile elastic strain from 2% to 100% and an in-plane thermal conductivity from 200 W/mK to 1,750 W/mK (preferably and typically greater than 500 W/mK). The heat spreader film typically has a thickness from 10 nm to 500 µm.

The elastomer or rubber must have a high elasticity—a high tensile elastic deformation value (2%-1,000%) that is fully recoverable. It is well-known in the art of materials science and engineering that, by definition, an "elastic deformation" is a deformation that is fully recoverable upon release of the mechanical load, and the recovery process is essentially instantaneous (no significant time delay). An elastomer, such as a vulcanized natural rubber, can exhibit a tensile elastic deformation from 2% up to 1,000% (10 times of its original length), more typically from 10% to 800%, and further more typically from 50% to 500%, and most typically and desirably from 100% to 300%. If you use two hands to stretch a rubber band from 5 cm to, say, 40 cm and then release the rubber band from one hand, the rubber band immediately snaps back to substantially the original length. Such a deformation (800% in this example) is fully recoverable and there is substantially no plastic deformation (no permanent deformation). No materials other than elastomers or rubbers exhibit such a high-elasticity behavior.

For instance, although a metal typically has a high tensile ductility (i.e. can be extended to a large extent without breakage; e.g. from 10% to 200%), the majority of the deformation is plastic deformation (non-recoverable) and only a small amount of deformation is elastic deformation (i.e. the recoverable deformation being typically <1% and more typically <0.2%). Similarly, a non-elastomer polymer or plastic (thermoplastic or thermoset resin) may be able to stretch to a large extent, but most of the deformation is plastic deformation, a permanent deformation that is not recoverable upon release of the stress/strain. For instance, polyethylene (PE) may be able to get stretched to up to 200% under tensile load, but the majority (>98%) of such a deformation is non-recoverable, permanent deformation commonly referred to as the plastic deformation.

In some embodiments, the elastomer or rubber contains a material selected from natural polyisoprene (e.g. cis-1,4-polyisoprene natural rubber (NR) and trans-1,4-polyisoprene gutta-percha), synthetic polyisoprene (IR for isoprene rubber), polybutadiene (BR for butadiene rubber), chloroprene rubber (CR), polychloroprene (e.g. Neoprene, Baypren etc.), butyl rubber (copolymer of isobutylene and isoprene, IIR), including halogenated butyl rubbers (chloro butyl rubber (CIIR) and bromo butyl rubber (BIIR), styrene-butadiene rubber (copolymer of styrene and butadiene, SBR), nitrile rubber (copolymer of butadiene and acrylonitrile, NBR), EPM (ethylene propylene rubber, a copolymer of ethylene and propylene), EPDM rubber (ethylene propylene diene rubber, a terpolymer of ethylene, propylene and a diene-component), epichlorohydrin rubber (ECO), polyacrylic rubber (ACM, ABR), silicone rubber (SI, Q, VMQ), fluorosilicone rubber (FVMQ), fluoroelastomers (FKM, and FEPM; such as Viton, Tecnoflon, Fluorel, Aflas and Dai-El), perfluoroelastomers (FFKM: Tecnoflon PFR, Kalrez, Chemraz, Perlast), polyether block amides (PEBA), chlorosulfonated polyethylene (CSM; e.g. Hypalon), and ethylene-vinyl acetate (EVA), thermoplastic elastomers (TPE), protein resilin, protein elastin, ethylene oxide-epichlorohydrin copolymer, polyurethane, urethane-urea copolymer, and combinations thereof.

The resulting heat spreader film containing a properly selected elastomer or rubber as a binder or matrix material to hold the aligned graphene sheets together is surprisingly capable of being stretched to a tensile elastic deformation >2%, more typically >5%, further more typically >10%, still more typically >20%, and often >50% (e.g. up to 100%).

It may be noted that such a high elasticity characteristic enables the heat spreader film to be bent or fold back and forth tens of thousands of times without significantly degrading the thermal conductivity. The thermal conductivity, typically from 500 to 1,750 W/mk before the first bending, can maintain >80% (typically >90%) of the original thermal conductivity after repeated bending by 10000 times.

Preferably, in the above-cited embodiments, the elastomer or rubber is in an amount from 0.001% to 20% by weight, more preferably from 0.01% to 10% and further more preferably from 0.1% to 1%.

In certain preferred embodiments, the graphene sheets contain mostly single-layer graphene (90% to 100%) having an average number of layers between 1 and 2. In certain embodiments, the graphene sheets contain single-layer graphene and few-layer graphene sheets having an average number of layers less than 5. Few-layer graphene is commonly defined as those graphene sheets having 2-10 layers of graphene planes.

In some highly useful embodiments, the heat spreader film is in a thin film form having a thickness from 5 nm to 500 μm and the graphene sheets are substantially aligned parallel to a thin film plane. In some preferred embodiments, the heat spreader is in a thin film form having a thickness from 10 nm to 100 μm and graphene sheets being aligned parallel to a thin film plane.

Typically, the disclosed heat spreader film has a tensile strength no less than 100 MPa, a tensile modulus no less than 25 GPa, a thermal conductivity no less than 500 W/mK, and/or an electrical conductivity no less than 5,000 S/cm, all measured along a thin film plane direction. Typically and preferably, the metal matrix nanocomposite has a tensile strength no less than 300 MPa, a tensile modulus no less than 50 GPa, a thermal conductivity no less than 800 W/mK, and/or an electrical conductivity no less than 8,000 S/cm, all measured along a thin film plane direction. In many cases, the elastic heat spreader film has a tensile strength no less than 400 MPa, a tensile modulus no less than 150 GPa, a thermal conductivity no less than 1,200 W/mK, and/or an electrical conductivity no less than 12,000 S/cm, all measured along a thin film plane direction. Some of the disclosed heat spreader films exhibit a tensile strength no less than 500 MPa, a tensile modulus no less than 250 GPa, a thermal conductivity no less than 1,500 W/mK, and/or an electrical conductivity no less than 20,000 S/cm, all measured along a thin film plane direction.

In some embodiments, the elastic heat spreader film has a thickness t, a front surface, and a back surface, wherein the elastomer/rubber is impregnated from two primary surfaces (front and back surfaces). The elastomer or rubber is able to penetrate from the front surface into a zone of the film by a distance ⅓ t and/or penetrate from the back surface into a zone at least by a distance ⅓ t and there is an elastomer-free core (i.e. the elastomer or rubber does not reach the central or core area of the film). The size of this elastomer-free core is typically from 1/10 t to ⅘ t.

In certain embodiments, the graphene sheets contain a functional group attached thereto to make the graphene sheets exhibit a negative Zeta potential having a value from −55 mV to −0.1 mV.

The graphene sheets may contain a chemical functional group selected from alkyl or aryl silane, alkyl or aralkyl group, hydroxyl group, carboxyl group, epoxide, carbonyl group, amine group, sulfonate group (—SO$_3$H), aldehydic group, quinoidal, fluorocarbon, or a combination thereof.

In certain embodiments, the graphene sheets contain chemically functionalized graphene sheets having a chemical functional group selected from the group consisting of amidoamines, polyamides, aliphatic amines, modified aliphatic amines, cycloaliphatic amines, aromatic amines, anhydrides, ketimines, diethylenetriamine (DETA), triethylene-tetramine (TETA), tetraethylene-pentamine (TEPA), polyethylene polyamine, polyamine epoxy adduct, phenolic hardener, non-brominated curing agent, non-amine curatives, and combinations thereof.

The graphene sheets may contain a chemical functional group selected from OY, NHY, O═C—OY, P═C—NR'Y, O═C—SY, O═C—Y, —CR'1-OY, N'Y or C'Y, and Y is a functional group of a protein, a peptide, an amino acid, an enzyme, an antibody, a nucleotide, an oligonucleotide, an antigen, or an enzyme substrate, enzyme inhibitor or the transition state analog of an enzyme substrate or is selected from R'—OH, R'—NR'$_2$, R'SH, R'CHO, R'CN, R'X, R'N$^+$(R')$_3$X$^-$, R'SiR'$_3$, R'Si(—OR'—)$_y$R'$_{3-y}$, R'Si(—O—SiR'$_2$—)OR', R'—R", R'—N—CO, (C$_2$H$_4$O—)$_w$H, (—C$_3$H$_6$O—)$_w$H, (—C$_2$H$_4$O)$_w$—R', (C$_3$H$_6$O)$_w$—R', R', and w is an integer greater than one and less than 200.

The present disclosure also provides an electronic device containing the aforementioned heat spreader film as a component (e.g. as a thermal management element).

Additionally, the present disclosure provides a structural member containing the disclosed heat spreader film as a load-bearing and thermal management element.

Also disclosed herein is a process for producing an elastic heat spreader film. In some embodiments, the process comprises (a) a procedure of forming a layer of an aggregate or cluster of multiple oriented/aligned graphene sheets that are substantially parallel to one another and (b) a procedure of combining the graphene sheets with a rubber or elastomer to form an elastomer/rubber-impregnated aggregate/cluster of multiple oriented/aligned graphene sheets in such a manner that the rubber or elastomer chains fill in a gap or defect between graphene sheets and/or chemically bond to graphene sheets or the graphene sheets are dispersed in a matrix containing the elastomer or rubber, wherein the elastomer or rubber is in an amount from 0.001% to 20% by weight based on the total heat spreader film weight and wherein said elastic heat spreader film has a fully recoverable tensile elastic strain from 2% to 100% and an in-plane thermal conductivity from 200 W/mK to 1,750 W/mK.

The multiple graphene sheets preferably contain single-layer or few-layer graphene sheets selected from a pristine graphene material (defined as graphene having essentially zero % (<0.001% by weight) of non-carbon elements), or a non-pristine graphene material (defined as the graphene material having 0.001% to 25% by weight of non-carbon elements) wherein the non-pristine graphene is selected from graphene oxide, reduced graphene oxide, graphene fluoride, graphene chloride, graphene bromide, graphene iodide, hydrogenated graphene, nitrogenated graphene, doped graphene, chemically functionalized graphene, or a combination thereof.

In certain embodiments, the process comprises:
(A) Providing a layer of an aggregate or cluster of multiple graphene sheets; and
(B) impregnating an elastomer or rubber into the aggregate or cluster as a binder material or as a matrix material to produce an impregnated aggregate or cluster, wherein the multiple graphene sheets are bonded by the binder material or dispersed in the matrix material and the elastomer or rubber is in an amount from 0.001% to 20% by weight based on the total heat spreader film weight, wherein the elastic heat spreader film has a fully recoverable tensile elastic strain from 2% to 100% and an in-plane thermal conductivity from 200 W/mK to 1,750 W/mK.

The process may further comprise a step (C) of compressing the impregnated aggregate or cluster to produce the heat spreader film, wherein the multiple graphene sheets are substantially aligned to be parallel to one another.

In certain embodiments, the elastomer or rubber contains a material selected from natural polyisoprene, synthetic polyisoprene, polybutadiene, chloroprene rubber, polychloroprene, butyl rubber, styrene-butadiene rubber, nitrile rubber, ethylene propylene rubber, ethylene propylene diene rubber, metallocene-based poly(ethylene-co-octene) elastomer, poly(ethylene-co-butene) elastomer, styrene-ethylene-butadiene-styrene elastomer, epichlorohydrin rubber, polyacrylic rubber, silicone rubber, fluorosilicone rubber, perfluoro-elastomers, polyether block amides, chlorosulfonated polyethylene, ethylene-vinyl acetate, thermoplastic elastomer, protein resilin, protein elastin, ethylene oxide-epichlorohydrin copolymer, polyurethane, urethane-urea copolymer, a sulfonated version thereof, a precursor thereto, or a combination thereof.

In the disclosed process, in some embodiments, step (A) of providing a layer of an aggregate or cluster of multiple graphene sheets comprises a procedure selected from coating, casting, air-assisted clustering, liquid assisted clustering, spraying, printing, or a combination thereof. The coating procedure may be selected from vapor deposition, chemical coating, electrochemical coating or plating, spray-coating, painting, brushing, roll-to-roll coating, physical coating, or a combination thereof.

Preferably, the roll-to-roll coating is selected from air knife coating, Anilox coating, Flexo coating, gap coating or knife-over-roll coating, gravure coating, hot melt coating, immersion dip coating, kiss coating, metering rod or Meyer bar coating, roller coating, silk screen coating or rotary screen coating, slot-die coating, extrusion coating, inkjet printing, or a combination thereof.

In some embodiments, step (A) comprises (i) dispersing the multiple graphene sheets in a liquid medium to form a suspension (also herein referred to as dispersion or slurry), (ii) dispensing and depositing the suspension onto a surface of a substrate to form a wet aggregate or cluster of graphene sheets, and (iii) partially or completely removing the liquid medium from the wet aggregate or cluster to form the aggregate or cluster of multiple graphene sheets. In some embodiments, the process further comprises a procedure of compressing or consolidating the aggregate or cluster to align multiple graphene sheets and/or to reduce porosity in the aggregate or cluster. It may be noted that this compression procedure is addition to the compression procedure of step (C) in the disclosed process.

In some embodiments, step (A) comprises spraying the multiple graphene sheets, with or without a dispersing liquid medium, onto a solid substrate surface to form the aggregate or cluster of multiple graphene sheets. In some preferred embodiments, the process further comprises a procedure for heat-treating the layer of an aggregate or cluster of multiple graphene sheets, after step (A), at a temperature or multiple different temperatures selected from 50° C. to 3,200° C.

In some embodiments, the process may further comprise (after step (A)) a procedure of compressing or consolidating the aggregate or cluster to align multiple graphene sheets and/or to reduce porosity in the aggregate or cluster. In some embodiments, the process further comprises a procedure for heat-treating the layer of an aggregate or cluster of multiple graphene sheets, after the procedure of compressing or consolidating, at a temperature or multiple different temperatures selected from 50° C. to 3,200° C.

In some preferred embodiments, the heat treatment procedure comprises heat-treating the layer of an aggregate or cluster of multiple graphene sheets, at a temperature or multiple different temperatures selected from 50° C. to 3,200° C. (e.g. heating at 100° C. for 2 hours, 1,200° C. for 3 hours and then 2,800° C. for 1 hour). The heat treatment procedure is conducted before or after the procedure of compressing/consolidating, but before the impregnation of the elastomer or rubber.

In certain embodiments, step (A) comprises (i) preparing a graphene dispersion comprising multiple discrete graphene sheets dispersed in a liquid adhesive resin; and (ii) bringing the graphene dispersion in physical contact with a solid substrate surface and aligning the graphene sheets along a planar direction of the substrate surface wherein the graphene sheets are bonded to and supported by the substrate surface. In some embodiments, step (B) includes a procedure selected from spraying, painting, coating, casting, or printing a layer of the graphene dispersion onto the substrate surface and aligning the graphene sheets along a planar direction of the substrate surface so that graphene sheets are substantially parallel to one another and are bonded to and supported by the substrate surface. The solid substrate may contain a polymer film having a thickness from 5 μm to 200 μm.

In certain embodiments, step (A) includes a procedure of feeding a continuous polymer film, as the solid substrate, from a polymer film feeder into a graphene deposition chamber containing the graphene dispersion therein. Step (B) includes operating the graphene deposition chamber to deposit the graphene sheets and a binder/matrix elastomer/rubber (or its precursor, such as an uncured rubber or un-solidified thermoplastic elastomer) to at least a primary surface of the polymer substrate film for forming an elastomer/rubber-impregnated graphene cluster supported on the substrate film. In some embodiments, step (C) includes moving the elastomer/rubber-impregnated graphene cluster along with the substrate polymer film into a consolidating zone (e.g. containing a pair of rollers) which acts to align graphene sheets substantially parallel to each other and parallel to the substrate plane. The consolidating zone may include a provision (e.g. heater) to cure the rubber or consolidating the elastomer. The process may further include a procedure of operating a winding roller to collect the layer of rubber/elastomer-impregnated graphene cluster/aggregate supported on the substrate polymer film. This is a roll-to-roll or reel-to-reel process, amenable to mass production.

Step (A) typically begins with a step of producing isolated graphene sheets via chemical oxidation/intercalation of graphite, liquid phase exfoliation of graphite, electrochemical exfoliation of graphite, supercritical fluid exfoliation of graphite, or high-shear exfoliation of graphite, etc. These processes result in the formation of isolated, discrete graphene sheets that have a lateral dimension from 5 nm to 100 µm and a thickness from one atomic carbon plane of hexagonal carbon atoms (single-layer graphene, as small as 0.34 nm) to 10 hexagonal planes (2-10 planes, or few-layer graphene).

In certain embodiments, step (A) of providing a layer of an aggregate or cluster of multiple graphene sheets comprises a procedure selected from coating, casting, air-assisted clustering, liquid assisted clustering, spraying, printing, or a combination thereof. The coating procedure is preferably selected from vapor deposition, chemical coating, electrochemical coating or plating, spray-coating, painting, brushing, roll-to-roll coating, physical coating, or a combination thereof. Examples of physical coating processes include spin-coating, dip-coating, solution coating, etc.

Common roll-to-roll coating processes that can be used in the disclosed process include: air knife coating, Anilox coating, Flexo coating, gap coating (Knife-over-roll coating), gravure coating, hot melt coating, immersion dip coating, kiss coating, metering rod (Meyer bar) coating, roller coating (e.g. forward roller coating and reverse roll coating), silk screen coating (rotary screen coating), slot-die coating, extrusion coating (curtain coating, slide coating-bead coating, slot-die bead coating, tension-web slot-die coating), inkjet printing, or a combination thereof.

Preferably, the process further contains a step of chemically functionalizing the graphene sheets (pristine graphene, graphene oxide, reduced graphene oxide, fluorinated graphene, nitrogenated graphene, etc.) so that the graphene sheets exhibit a negative Zeta potential preferably from −55 mV to −0.1 mV in a desired solution. This Zeta potential can promote attraction of certain rubber functional groups to graphene surfaces.

In step (B), alignment of graphene sheets (in the presence or absence of an elastomer/rubber resin) can be achieved through a forced assembly approach that is schematically illustrated in FIG. 3(A), FIG. 3(B), FIG. 3(C), and FIG. 3(D). Thus, the present disclosure also provides a process for producing an elastic heat spreader film, the process comprising: (a) dispersing multiple discrete graphene sheets in a liquid medium to form a graphene dispersion; (b) subjecting the graphene dispersion to a forced assembling and orientating procedure, forcing the graphene sheets to form a layer of an aggregate/cluster of aligned graphene sheets that are substantially parallel to one another; and (c) impregnating a rubber/elastomer (or its precursor) into the aggregate/cluster and consolidating the layer of aligned rubber/elastomer-impregnated graphene sheets into the desired elastic heat spreader film wherein the graphene sheets are bonded by or dispersed in the rubber/elastomer material, substantially aligned to be parallel to one another, and in an amount from 80% to 99.999% by weight based on the total heat spreader weight. Although not preferred, the graphene dispersion may contain the elastomer/rubber or its precursor (e.g. uncured resin) prior to subjecting the graphene dispersion to a forced assembling and orientating procedure.

In the disclosed process, the forced assembling and orientating procedure may include introducing the graphene dispersion, having an initial volume $V_1$, in a mold cavity cell and driving a piston into the mold cavity cell to reduce the graphene dispersion volume to a smaller value $V_2$, allowing excess liquid medium to flow out of the cavity cell and aligning the graphene sheets along a desired direction.

In certain embodiments, the forced assembling and orientating procedure includes introducing the graphene dispersion, having an initial volume $V_1$, in a mold cavity cell and applying a suction pressure through a porous wall of the mold cavity to reduce the graphene dispersion volume to a smaller value $V_2$, allowing excess liquid medium to flow out of the cavity cell through the porous wall and aligning the graphene sheets along a desired direction.

The forced assembling and orientating procedure may include introducing a first layer of graphene dispersion onto a surface of a supporting conveyor and driving the layer of graphene dispersion supported on the conveyor through at least a pair of pressing rollers to reduce the thickness of the graphene dispersion layer and align the graphene sheets along a direction parallel to the conveyor surface for forming a layer of aligned graphene sheets.

The process may further include a step of introducing a second layer of a graphene dispersion onto a surface of the layer of graphene sheets to form a two-layer structure, and driving the two-layer structure through at least a pair of pressing rollers to reduce a thickness of the second layer of graphene dispersion and align the graphene sheets along a direction parallel to the conveyor surface for forming a layer of graphene sheets.

The process may further include a step of compressing or roll-pressing the layer of graphene sheets to reduce the thickness of the layer and to improve orientation of the graphene sheets.

Thus, in some specific embodiments, the disclosure also provides an alternative procedure to obtain a heat spreader film comprising a layer of rubber/elastomer-impregnated aggregate/cluster of aligned graphene sheets that are bonded on a primary surface of a polymer film. This procedure comprises:

(a) Feeding a continuous polymer film from a polymer film feeder into a graphene deposition chamber, wherein the graphene deposition chamber accommodates a graphene dispersion comprising multiple discrete graphene sheets dispersed in a liquid resin (a precursor to an elastomer or rubber), as a precursor to a rubber/elastomer (e.g. uncured monomer and a curing agent for a rubber/elastomer);

(b) Operating the graphene deposition chamber to deposit the graphene sheets and the resin to at least a primary surface of the polymer film for forming a resin/graphene-coated polymer film;

(c) Moving the graphene-coated film into a consolidating region which consolidates (e.g. curing and compressing) the resin/graphene-coated polymer film to obtain a heat spreader film supported on a polymer film; and (d) Operating a winding roller to collect the heat spreader film;

wherein the multiple graphene sheets contain single-layer or few-layer graphene sheets selected from a pristine graphene material having essentially zero % of non-carbon elements, or a non-pristine graphene material having 0.001% to 25% by weight of non-carbon elements wherein said non-pristine graphene is selected from graphene oxide, reduced graphene oxide, graphene fluoride, graphene chloride, graphene bromide, graphene iodide, hydrogenated graphene, nitrogenated graphene, doped graphene, chemically functionalized graphene, or a combination thereof.

The process may further comprise implementing the elastic heat spreader film into a device as a thermal management element in this device.

DESCRIPTION OF THE PREFERRED EMBODIMENTS

The present disclosure provides an elastic heat spreader film comprising: (A) an elastomer or rubber as a binder material or a matrix material; and (B) multiple graphene sheets that are bonded by the binder material or dispersed in the matrix material, wherein the multiple graphene sheets are substantially aligned to be parallel to one another and wherein the elastomer or rubber is in an amount from 0.001% to 20% by weight based on the total heat spreader film weight; wherein the multiple graphene sheets contain single-layer or few-layer graphene sheets selected from a pristine graphene material having essentially zero % of non-carbon elements, or a non-pristine graphene material having 0.001% to 25% by weight of non-carbon elements wherein the non-pristine graphene is selected from graphene oxide, reduced graphene oxide, graphene fluoride, graphene chloride, graphene bromide, graphene iodide, hydrogenated graphene, nitrogenated graphene, doped graphene, chemically functionalized graphene, or a combination thereof (preferably the chemically functionalized graphene is not graphene oxide); and wherein the elastic heat spreader film has a fully recoverable tensile elastic strain from 2% to 100% (preferably greater than 5%, more preferably greater than 10%, and further preferably greater than 20%) and an in-plane thermal conductivity from 200 W/mK to 1,750 W/mK (preferably and typically greater than 500 W/mK). The heat spreader film typically has a thickness from 10 nm to 500 μm.

The elastomer or rubber material must have a high elasticity (high elastic deformation value). An elastic deformation is a deformation that is fully recoverable and the recovery process is essentially instantaneous (no significant time delay). An elastomer, such as a vulcanized natural rubber, can exhibit an elastic deformation from 2% up to 1,000% (10 times of its original length), more typically from 10% to 800%, and further more typically from 50% to 500%, and most typically and desirably from 100% to 500%. It may be noted that although a metal or a plastic material typically has a high ductility (i.e. can be extended to a large extent without breakage), the majority of the deformation is plastic deformation (i.e. non-recoverable, permanent deformation) and only a small amount (typically <1% and more typically <0.2%) is elastic deformation.

A broad array of elastomers, as a neat resin alone or as a matrix material for an elastomeric matrix composite, can be used to encapsulate an anode active material particle or multiple particles. Encapsulation means substantially fully embracing the particle(s) without allowing the particle to be in direct contact with electrolyte in the battery. The elastomeric material may be selected from natural polyisoprene (e.g. cis-1,4-polyisoprene natural rubber (NR) and trans-1,4-polyisoprene gutta-percha), synthetic polyisoprene (IR for isoprene rubber), polybutadiene (BR for butadiene rubber), chloroprene rubber (CR), polychloroprene (e.g. Neoprene, Baypren etc.), butyl rubber (copolymer of isobutylene and isoprene, IIR), including halogenated butyl rubbers (chloro butyl rubber (CIIR) and bromo butyl rubber (BIIR), styrene-butadiene rubber (copolymer of styrene and butadiene, SBR), nitrile rubber (copolymer of butadiene and acrylonitrile, NBR), EPM (ethylene propylene rubber, a copolymer of ethylene and propylene), EPDM rubber (ethylene propylene diene rubber, a terpolymer of ethylene, propylene and a diene-component), epichlorohydrin rubber (ECO), polyacrylic rubber (ACM, ABR), silicone rubber (SI, Q, VMQ), fluorosilicone rubber (FVMQ), fluoroelastomers (FKM, and FEPM; such as Viton, Tecnoflon, Fluorel, Aflas and Dai-El), perfluoroelastomers (FFKM: Tecnoflon PFR, Kalrez, Chemraz, Perlast), polyether block amides (PEBA), chlorosulfonated polyethylene (CSM; e.g. Hypalon), and ethylene-vinyl acetate (EVA), thermoplastic elastomers (TPE), protein resilin, protein elastin, ethylene oxide-epichlorohydrin copolymer, polyurethane, urethane-urea copolymer, and combinations thereof.

The urethane-urea copolymer film usually consists of two types of domains, soft domains and hard ones. Entangled linear backbone chains consisting of poly(tetramethylene ether) glycol (PTMEG) units constitute the soft domains, while repeated methylene diphenyl diisocyanate (MDI) and ethylene diamine (EDA) units constitute the hard domains. Actually most of the thermoplastic elastomers have hard domains and soft domains in their structure, or hard domains dispersed in a soft matrix. The hard domains can help hold the lightly cross-linked or physically entangled chains together, enabling deformation reversibility of the chains.

The multiple graphene sheets typically contain single-layer or few-layer graphene sheets selected from a pristine graphene material having essentially zero % of non-carbon elements, or a non-pristine graphene material having 0.001% to 25% by weight of non-carbon elements wherein the non-pristine graphene is selected from graphene oxide, reduced graphene oxide, graphene fluoride, graphene chloride, graphene bromide, graphene iodide, hydrogenated graphene, nitrogenated graphene, doped graphene, chemically functionalized graphene, or a combination thereof and wherein the chemically functionalized graphene is not graphene oxide and the graphene sheets are spaced by the matrix material having an average spacing from 1 nm to 300 nm.

The resulting heat spreader film containing a properly selected elastomer or rubber as a binder or matrix material to hold the aligned graphene sheets together is surprisingly capable of being stretched to a tensile elastic deformation >2%, more typically >5%, further more typically >10%, still more typically >20%, and often >50% (e.g. up to 100%).

It may be noted that such a high elasticity characteristic enables the heat spreader film to be bent or fold back and forth tens of thousands of times without significantly degrading the thermal conductivity. The thermal conductivity, typically from 500 to 1,750 W/mk before the first bending, can maintain >80% (typically >90%) of the original thermal conductivity after repeated bending by 10000 times.

Preferably, in the above-cited embodiments, the elastomer or rubber is in an amount from 0.001% to 20% by weight, more preferably from 0.01% to 10% and further more preferably from 0.1% to 1%.

In some highly useful embodiments, the heat spreader film is in a thin film form having a thickness from 5 nm to 500 μm and the graphene sheets are substantially aligned parallel to a thin film plane. In some preferred embodiments, the heat spreader is in a thin film form having a thickness from 10 nm to 100 μm and graphene sheets being aligned parallel to a thin film plane.

Typically, the disclosed heat spreader film has a tensile strength no less than 100 MPa, a tensile modulus no less than 25 GPa, a thermal conductivity no less than 500 W/mK, and/or an electrical conductivity no less than 5,000 S/cm, all measured along a thin film plane direction. Typically and preferably, the film has a tensile strength no less than 300 MPa, a tensile modulus no less than 50 GPa, a thermal conductivity no less than 800 W/mK, and/or an electrical conductivity no less than 8,000 S/cm, all measured along a thin film plane direction. In many cases, the film has a tensile strength no less than 400 MPa, a tensile modulus no less than 150 GPa, a thermal conductivity no less than 1,200 W/mK, and/or an electrical conductivity no less than 12,000 S/cm, all measured along a thin film plane direction. Some of the disclosed heat spreader films exhibit a tensile strength no less than 500 MPa, a tensile modulus no less than 250 GPa, a thermal conductivity no less than 1,500 W/mK, and/or an electrical conductivity no less than 20,000 S/cm, all measured along a thin film plane direction.

Typically, the invented film exhibits a Vickers hardness value from 70 to 400 HV.

The chemically functionalized graphene sheets are preferably those exhibiting a negative Zeta potential in a given dispersion, typically in the range from −55 mV to −0.1 mV. These functionalized graphene sheets typically have a functional group that is attached to these sheets for imparting negative Zeta potential thereto. Zeta potential is the potential difference between the dispersion medium and the stationary layer of fluid attached to the dispersed particles (e.g. graphene sheets) dispersed in this dispersion medium (e.g. water, organic solvent, electrolyte etc.). Several commercially available instruments (e.g. Zetasizer Nano from Malvern Panalytical and SZ-100 from Horiba Scientific) can be used to measure the Zeta potential of different types of graphene sheets in different dispersion mediums.

It may be noted that a given type of graphene (e.g. graphene oxide or reduced graphene oxide) can exhibit a positive or negative Zeta potential and its value can vary, depending upon the chemical functional groups attached to graphene sheets and the dispersion medium used. Unless otherwise specified, the Zeta potential values provided are for the graphene sheets dispersed in an aqueous solution having a pH vale of 5.0-9.0 (mostly 7.0).

In some embodiments, the chemically functionalized graphene sheets contain a chemical functional group selected from alkyl or aryl silane, alkyl or aralkyl group, hydroxyl group, carboxyl group, amine group, sulfonate group (—SO$_3$H), aldehydic group, quinoidal, fluorocarbon, or a combination thereof. Alternatively, the functional group contains a derivative of an azide compound selected from the group consisting of 2-Azidoethanol, 3-Azidopropan-1-amine, 4-(2-Azidoethoxy)-4-oxobutanoic acid, 2-Azidoethyl-2-bromo-2-methylpropanoate, chlorocarbonate, azidocarbonate, dichlorocarbene, carbene, aryne, nitrene, (R-)-oxycarbonyl nitrenes, where R=any one of the following groups, and combinations thereof.

In certain embodiments, the functional group is selected from the group consisting of hydroxyl, peroxide, ether, keto, and aldehyde. In certain embodiments, the functionalizing agent contains a functional group selected from the group consisting of $SO_3H$, COOH, $NH_2$, OH, R'CHOH, CHO, CN, COCl, halide, COSH, SH, COOR', SW, $SiR'_3$, $Si(—OR'—)_yR'_{3-y}$, $Si(—O—SiR'_2—)OR'$, R", Li, $AlR'_2$, Hg—X, $TlZ_2$ and Mg—X; wherein y is an integer equal to or less than 3, R' is hydrogen, alkyl, aryl, cycloalkyl, or aralkyl, cycloaryl, or poly(alkylether), R" is fluoroalkyl, fluoroaryl, fluorocycloalkyl, fluoroaralkyl or cycloaryl, X is halide, and Z is carboxylate or trifluoroacetate, and combinations thereof.

The functional group may be selected from the group consisting of amidoamines, polyamides, aliphatic amines, modified aliphatic amines, cycloaliphatic amines, aromatic amines, anhydrides, ketimines, diethylenetriamine (DETA), triethylene-tetramine (TETA), tetraethylene-pentamine (TEPA), polyethylene polyamine, polyamine epoxy adduct, phenolic hardener, non-brominated curing agent, non-amine curatives, and combinations thereof.

In some embodiments, the functional group may be selected from OY, NHY, O=C—OY, P=C—NR'Y, O=C—SY, O=C—Y, —CR'1-OY, N'Y or C'Y, and Y is a functional group of a protein, a peptide, an amino acid, an enzyme, an antibody, a nucleotide, an oligonucleotide, an antigen, or an enzyme substrate, enzyme inhibitor or the transition state analog of an enzyme substrate or is selected from R'—OH, R'—$NR'_2$, R'SH, R'CHO, R'CN, R'X, $R'N^+(R')_3X^-$, $R'SiR'_3$, $R'Si(—OR'—)_yR'_{3-y}$, $R'Si(—O—SiR'_2—)OR'$, R'—R", R'—N—CO, $(C_2H_4O—)_wH$, $(—C_3H_6O—)_wH$, $(—C_2H_4O)_w—R'$, $(C_3H_6O)_w—R'$, R', and w is an integer greater than one and less than 200.

The preparation of graphene sheets and graphene dispersions is described as follows: Carbon is known to have five unique crystalline structures, including diamond, fullerene (0-D nano graphitic material), carbon nano-tube or carbon nano-fiber (1-D nano graphitic material), graphene (2-D nano graphitic material), and graphite (3-D graphitic material). The carbon nano-tube (CNT) refers to a tubular structure grown with a single wall or multi-wall. Carbon nanotubes (CNTs) and carbon nano-fibers (CNFs) have a diameter on the order of a few nanometers to a few hundred nanometers. Their longitudinal, hollow structures impart unique mechanical, electrical and chemical properties to the material. The CNT or CNF is a one-dimensional nano carbon or 1-D nano graphite material.

Our research group pioneered the development of graphene materials and related production processes as early as 2002: (1) B. Z. Jang and W. C. Huang, "Nano-scaled Graphene Plates," U.S. Pat. No. 7,071,258 (Jul. 4, 2006), application submitted on Oct. 21, 2002; (2) B. Z. Jang, et al. "Process for Producing Nano-scaled Graphene Plates," U.S. patent application Ser. No. 10/858,814 (Jun. 3, 2004) (U.S. Pat. Pub. No. 2005/0271574); and (3) B. Z. Jang, A. Zhamu, and J. Guo, "Process for Producing Nano-scaled Platelets and Nanocomposites," U.S. patent application Ser. No. 11/509,424 (Aug. 25, 2006) (U.S. Pat. Pub. No. 2008/0048152).

A single-layer graphene sheet is composed of carbon atoms occupying a two-dimensional hexagonal lattice. Multi-layer graphene is a platelet composed of more than one graphene plane. Individual single-layer graphene sheets and multi-layer graphene platelets are herein collectively called nano graphene platelets (NGPs) or graphene materials. NGPs include pristine graphene (essentially 99% of carbon atoms), slightly oxidized graphene (<5% by weight of oxygen), graphene oxide (≥5% by weight of oxygen), slightly fluorinated graphene (<5% by weight of fluorine), graphene fluoride ((≥5% by weight of fluorine), other halogenated graphene, and chemically functionalized graphene.

NGPs have been found to have a range of unusual physical, chemical, and mechanical properties. For instance, graphene was found to exhibit the highest intrinsic strength and highest thermal conductivity of all existing materials. Although practical electronic device applications for graphene (e.g., replacing Si as a backbone in a transistor) are not envisioned to occur within the next 5-10 years, its application as a nano filler in a composite material and an electrode material in energy storage devices is imminent. The availability of processable graphene sheets in large quantities is essential to the success in exploiting composite, energy, and other applications for graphene.

Figure 1:
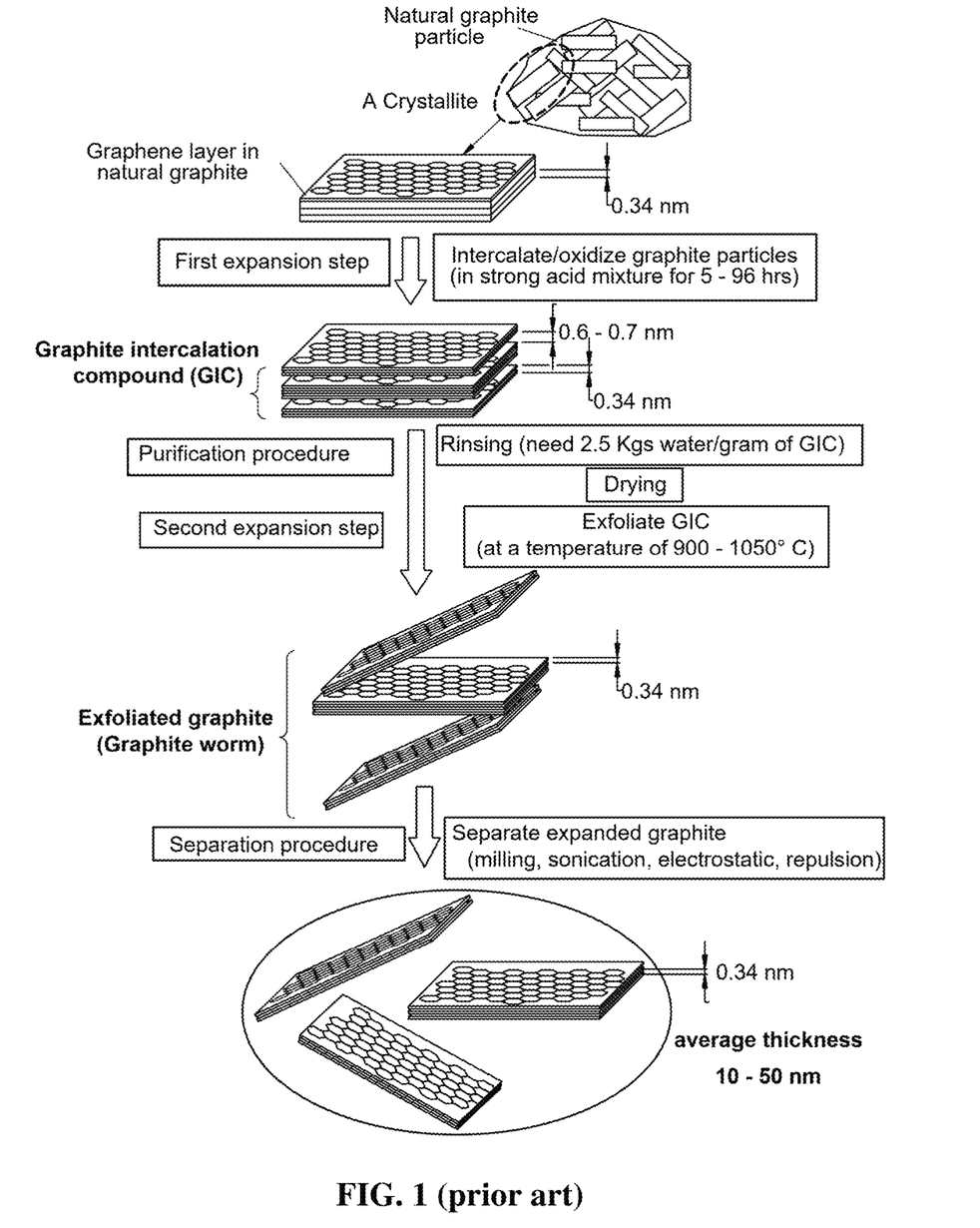
FIG. 1 A flow chart showing the most commonly used process for producing oxidized graphene sheets that entails chemical oxidation/intercalation, rinsing, and high-temperature exfoliation procedures.

A highly useful approach (FIG. 1) entails treating natural graphite powder with an intercalant and an oxidant (e.g., concentrated sulfuric acid and nitric acid, respectively) to obtain a graphite intercalation compound (GIC) or, actually, graphite oxide (GO). [William S. Hummers, Jr., et al., Preparation of Graphitic Oxide, Journal of the American Chemical Society, 1958, p. 1339.] Prior to intercalation or oxidation, graphite has an inter-graphene plane spacing of approximately 0.335 nm ($L_d=½\ d_{002}=0.335$ nm). With an intercalation and oxidation treatment, the inter-graphene spacing is increased to a value typically greater than 0.6 nm. This is the first expansion stage experienced by the graphite material during this chemical route. The obtained GIC or GO is then subjected to further expansion (often referred to as exfoliation) using either a thermal shock exposure or a solution-based, ultrasonication-assisted graphene layer exfoliation approach.

In the thermal shock exposure approach, the GIC or GO is exposed to a high temperature (typically 800-1,050° C.) for a short period of time (typically 15 to 60 seconds) to exfoliate or expand the GIC or GO for the formation of exfoliated or further expanded graphite, which is typically in the form of a "graphite worm" composed of graphite flakes that are still interconnected with one another. This thermal shock procedure can produce some separated graphite flakes or graphene sheets, but normally the majority of graphite flakes remain interconnected. Typically, the exfoliated graphite or graphite worm is then subjected to a flake separation treatment using air milling, mechanical shearing, or ultrasonication in water. Hence, approach 1 basically entails three distinct procedures: first expansion (oxidation or intercalation), further expansion (or "exfoliation"), and separation.

In the solution-based separation approach, the expanded or exfoliated GO powder is dispersed in water or aqueous alcohol solution, which is subjected to ultrasonication. It is important to note that in these processes, ultrasonification is used after intercalation and oxidation of graphite (i.e., after first expansion) and typically after thermal shock exposure of the resulting GIC or GO (after second expansion). Alternatively, the GO powder dispersed in water is subjected to an ion exchange or lengthy purification procedure in such a manner that the repulsive forces between ions residing in the inter-planar spaces overcome the inter-graphene van der Waals forces, resulting in graphene layer separations.

In the aforementioned examples, the starting material for the preparation of graphene sheets or NGPs is a graphitic material that may be selected from the group consisting of natural graphite, artificial graphite, graphite oxide, graphite fluoride, graphite fiber, carbon fiber, carbon nano-fiber, carbon nano-tube, mesophase carbon micro-bead (MCMB) or carbonaceous micro-sphere (CMS), soft carbon, hard carbon, and combinations thereof.

Graphite oxide may be prepared by dispersing or immersing a laminar graphite material (e.g., powder of natural flake graphite or synthetic graphite) in an oxidizing agent, typically a mixture of an intercalant (e.g., concentrated sulfuric acid) and an oxidant (e.g., nitric acid, hydrogen peroxide, sodium perchlorate, potassium permanganate) at a desired temperature (typically 0-70° C.) for a sufficient length of time (typically 4 hours to 5 days). The resulting graphite oxide particles are then rinsed with water several times to adjust the pH values to typically 2-5. The resulting suspension of graphite oxide particles dispersed in water is then subjected to ultrasonication to produce a dispersion of separate graphene oxide sheets dispersed in water. A small amount of reducing agent (e.g. $Na_4B$) may be added to obtain reduced graphene oxide (RDO) sheets.

In order to reduce the time required to produce a precursor solution or suspension, one may choose to oxidize the graphite to some extent for a shorter period of time (e.g., 30 minutes-4 hours) to obtain graphite intercalation compound (GIC). The GIC particles are then exposed to a thermal shock, preferably in a temperature range of 600-1,100° C. for typically 15 to 60 seconds to obtain exfoliated graphite or graphite worms, which are optionally (but preferably) subjected to mechanical shearing (e.g. using a mechanical shearing machine or an ultrasonicator) to break up the graphite flakes that constitute a graphite worm. Either the already separated graphene sheets (after mechanical shearing) or the un-broken graphite worms or individual graphite flakes are then re-dispersed in water, acid, or organic solvent and ultrasonicated to obtain a graphene dispersion.

The pristine graphene material is preferably produced by one of the following three processes: (A) Intercalating the graphitic material with a non-oxidizing agent, followed by a thermal or chemical exfoliation treatment in a non-oxidizing environment; (B) Subjecting the graphitic material to a supercritical fluid environment for inter-graphene layer penetration and exfoliation; or (C) Dispersing the graphitic material in a powder form to an aqueous solution containing a surfactant or dispersing agent to obtain a suspension and subjecting the suspension to direct ultrasonication to obtain a graphene dispersion.

In Procedure (A), a particularly preferred step comprises (i) intercalating the graphitic material with a non-oxidizing agent, selected from an alkali metal (e.g., potassium, sodium, lithium, or cesium), alkaline earth metal, or an alloy, mixture, or eutectic of an alkali or alkaline metal; and (ii) a chemical exfoliation treatment (e.g., by immersing potassium-intercalated graphite in ethanol solution).

In Procedure (B), a preferred step comprises immersing the graphitic material to a supercritical fluid, such as carbon dioxide (e.g., at temperature T>31° C. and pressure P>7.4 MPa) and water (e.g., at T>374° C. and P>22.1 MPa), for a period of time sufficient for inter-graphene layer penetration (tentative intercalation). This step is then followed by a sudden de-pressurization to exfoliate individual graphene layers. Other suitable supercritical fluids include methane, ethane, ethylene, hydrogen peroxide, ozone, water oxidation (water containing a high concentration of dissolved oxygen), or a mixture thereof.

In Procedure (C), a preferred step comprises (a) dispersing particles of a graphitic material in a liquid medium containing therein a surfactant or dispersing agent to obtain a suspension or slurry; and (b) exposing the suspension or slurry to ultrasonic waves (a process commonly referred to as ultrasonication) at an energy level for a sufficient length of time to produce a graphene dispersion of separated graphene sheets (non-oxidized NGPs) dispersed in a liquid medium (e.g. water, alcohol, or organic solvent).

NGPs can be produced with an oxygen content no greater than 25% by weight, preferably below 20% by weight, further preferably below 5%. Typically, the oxygen content is between 5% and 20% by weight. The oxygen content can be determined using chemical elemental analysis and/or X-ray photoelectron spectroscopy (XPS).

The laminar graphite materials used in the prior art processes for the production of the GIC, graphite oxide, and subsequently made exfoliated graphite, flexible graphite sheets, and graphene platelets were, in most cases, natural graphite. However, the present disclosure is not limited to natural graphite. The starting material may be selected from the group consisting of natural graphite, artificial graphite (e.g., highly oriented pyrolytic graphite, HOPG), graphite oxide, graphite fluoride, graphite fiber, carbon fiber, carbon nano-fiber, carbon nano-tube, mesophase carbon micro-bead (MCMB) or carbonaceous micro-sphere (CMS), soft carbon, hard carbon, and combinations thereof. All of these materials contain graphite crystallites that are composed of layers of graphene planes stacked or bonded together via van der Waals forces. In natural graphite, multiple stacks of graphene planes, with the graphene plane orientation varying from stack to stack, are clustered together. In carbon fibers, the graphene planes are usually oriented along a preferred direction. Generally speaking, soft carbons are carbonaceous materials obtained from carbonization of liquid-state, aromatic molecules. Their aromatic ring or graphene structures are more or less parallel to one another, enabling further graphitization. Hard carbons are carbonaceous materials obtained from aromatic solid materials (e.g., polymers, such as phenolic resin and polyfurfuryl alcohol). Their graphene structures are relatively randomly oriented and, hence, further graphitization is difficult to achieve even at a temperature higher than 2,500° C. But, graphene sheets do exist in these carbons.

Fluorinated graphene or graphene fluoride is herein used as an example of the halogenated graphene material group. There are two different approaches that have been followed to produce fluorinated graphene: (1) fluorination of pre-synthesized graphene: This approach entails treating graphene prepared by mechanical exfoliation or by CVD growth with fluorinating agent such as $XeF_2$, or F-based plasmas; (2) Exfoliation of multilayered graphite fluorides: Both mechanical exfoliation and liquid phase exfoliation of graphite fluoride can be readily accomplished [F. Karlicky, et al. "*Halogenated Graphenes: Rapidly Growing Family of Graphene Derivatives*" ACS Nano, 2013, 7 (8), pp 6434-6464].

Interaction of $F_2$ with graphite at high temperature leads to covalent graphite fluorides $(CF)_n$ or $(C_2F)_n$, while at low temperatures graphite intercalation compounds (GIC) $C_xF$ ($2 \leq x \leq 24$) form. In $(CF)_n$ carbon atoms are sp3-hybridized and thus the fluorocarbon layers are corrugated consisting of trans-linked cyclohexane chairs. In $(C_2F)_n$ only half of the C atoms are fluorinated and every pair of the adjacent carbon sheets are linked together by covalent C—C bonds. Systematic studies on the fluorination reaction showed that the resulting F/C ratio is largely dependent on the fluorination temperature, the partial pressure of the fluorine in the fluorinating gas, and physical characteristics of the graphite precursor, including the degree of graphitization, particle size, and specific surface area. In addition to fluorine ($F_2$), other fluorinating agents may be used, although most of the available literature involves fluorination with $F_2$ gas, sometimes in presence of fluorides.

For exfoliating a layered precursor material to the state of individual single graphene layers or few-layers, it is necessary to overcome the attractive forces between adjacent layers and to further stabilize the layers. This may be achieved by either covalent modification of the graphene surface by functional groups or by non-covalent modification using specific solvents, surfactants, polymers, or donor-acceptor aromatic molecules. The process of liquid phase exfoliation includes ultra-sonic treatment of a graphite fluoride in a liquid medium to produce graphene fluoride sheets dispersed in the liquid medium. The resulting dispersion can be directly used in the graphene deposition of polymer component surfaces.

The nitrogenation of graphene can be conducted by exposing a graphene material, such as graphene oxide, to ammonia at high temperatures (200-400° C.). Nitrogenated graphene could also be formed at lower temperatures by a hydrothermal method; e.g. by sealing GO and ammonia in an autoclave and then increased the temperature to 150-250° C. Other methods to synthesize nitrogen doped graphene include nitrogen plasma treatment on graphene, arc-discharge between graphite electrodes in the presence of ammonia, ammonolysis of graphene oxide under CVD conditions, and hydrothermal treatment of graphene oxide and urea at different temperatures.

For the purpose of defining the claims of the instant application, NGPs or graphene materials include discrete sheets/platelets of single-layer and multi-layer (typically less than 10 layers, the few-layer graphene) pristine graphene, graphene oxide, reduced graphene oxide (RGO), graphene fluoride, graphene chloride, graphene bromide, graphene iodide, hydrogenated graphene, nitrogenated graphene, chemically functionalized graphene, doped graphene (e.g. doped by B or N). Pristine graphene has essentially 0% oxygen. RGO typically has an oxygen content of 0.001%-5% by weight. Graphene oxide (including RGO) can have 0.001%-50% by weight of oxygen. Other than pristine graphene, all the graphene materials have 0.001%-50% by weight of non-carbon elements (e.g. O, H, N, B, F, Cl, Br, I, etc.). These materials are herein referred to as non-pristine graphene materials. The presently invented graphene can contain pristine or non-pristine graphene and the invented method allows for this flexibility. These graphene sheets all can be chemically functionalized.

Graphene sheets have a significant proportion of edges that correspond to the edge planes of graphite crystals. The carbon atoms at the edge planes are reactive and must contain some heteroatom or group to satisfy carbon valency. Further, there are many types of functional groups (e.g. hydroxyl and carboxylic) that are naturally present at the edge or surface of graphene sheets produced through chemical or electrochemical methods. Many chemical function groups (e.g. —$NH_2$, etc.) can be readily imparted to graphene edges and/or surfaces using methods that are well-known in the art.

The functionalized NGPs of the instant disclosure can be directly prepared by sulfonation, electrophilic addition to deoxygenated graphene platelet surfaces, or metallization. The graphene platelets can be processed prior to being contacted with a functionalizing agent. Such processing may include dispersing the graphene platelets in a solvent. In some instances, the platelets or may then be filtered and dried prior to contact. One particularly useful type of functional group is the carboxylic acid moieties, which naturally exist on the surfaces of NGPs if they are prepared from the acid intercalation route discussed earlier. If carboxylic acid functionalization is needed, the NGPs may be subjected to chlorate, nitric acid, or ammonium persulfate oxidation.

Carboxylic acid functionalized graphene sheets or platelets are particularly useful because they can serve as the starting point for preparing other types of functionalized NGPs. For example, alcohols or amides can be easily linked to the acid to give stable esters or amides. If the alcohol or amine is part of a di- or poly-functional molecule, then linkage through the O- or NH-leaves the other functionalities as pendant groups. These reactions can be carried out using any of the methods developed for esterifying or aminating carboxylic acids with alcohols or amines as known in the art. Examples of these methods can be found in G. W. Anderson, et al., J. Amer. Chem. Soc. 96, 1839 (1965), which is hereby incorporated by reference in its entirety. Amino groups can be introduced directly onto graphitic platelets by treating the platelets with nitric acid and sulfuric acid to obtain nitrated platelets, then chemically reducing the nitrated form with a reducing agent, such as sodium dithionite, to obtain amino-functionalized platelets.

Figure 2:
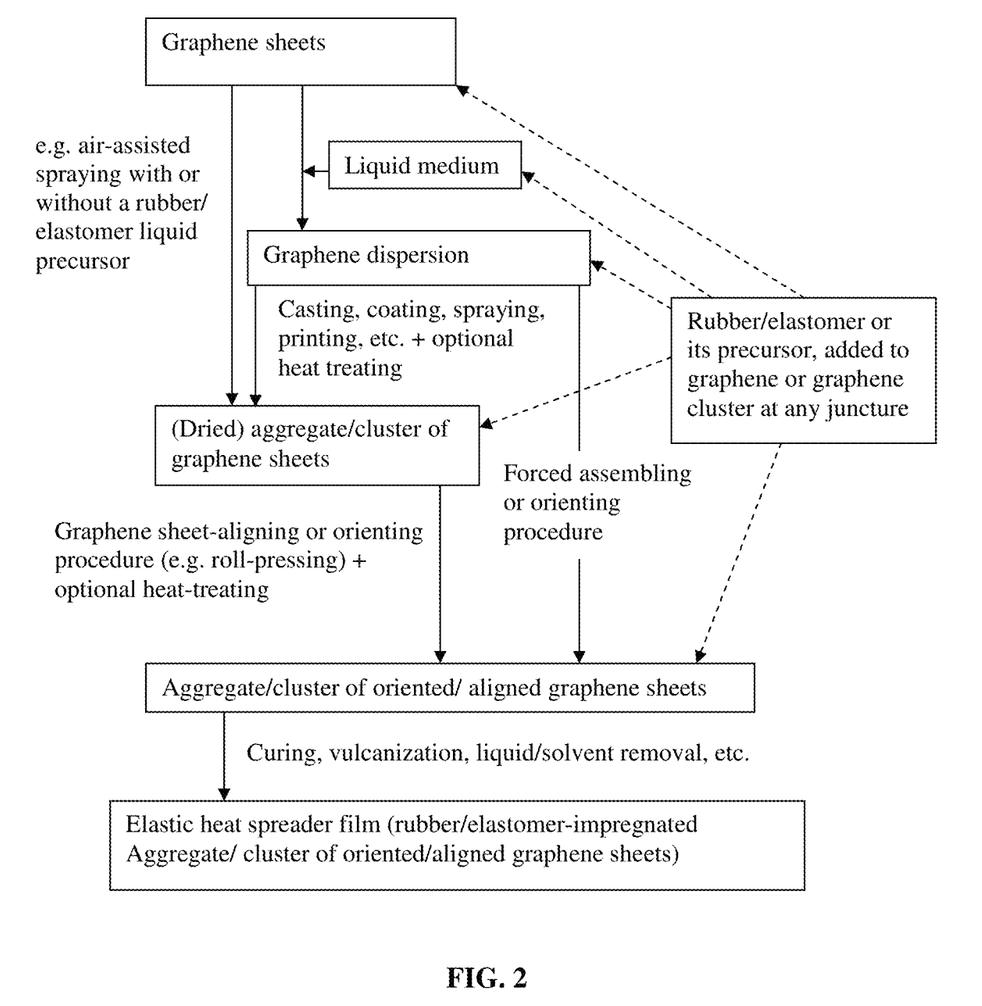
FIG. 2 Schematic of various routes of the process for producing elastic heat spreader containing elastomer/rubber-impregnated aggregate/cluster of oriented/aligned graphene sheets, according to certain embodiments of the disclosure.

Also disclosed herein is a process for producing an elastic heat spreader film, as schematically illustrated in FIG. 2. The process generally comprises (a) a procedure of forming a layer of an aggregate (or cluster) of oriented/aligned graphene sheets that are substantially parallel to one another and (b) a procedure of combining graphene sheets with a rubber or elastomer wherein the rubber/elastomer chains fill in the gaps between graphene sheets and/or chemically bond to graphene sheets or the graphene sheets are dispersed in the rubber/elastomer matrix. Procedures (a) and (b) can occur concurrently or sequentially (e.g. procedure (a) followed by (b), or (b) first followed by (a)). As illustrated in FIG. 2, the rubber or elastomer (or its precursor, such as monomers, oligomers, un-cured rubber chains, etc.) can be brought to be in contact with the graphene sheets during any of the different stages of the graphene sheet cluster-forming and aligning procedure.

Figure 3A:
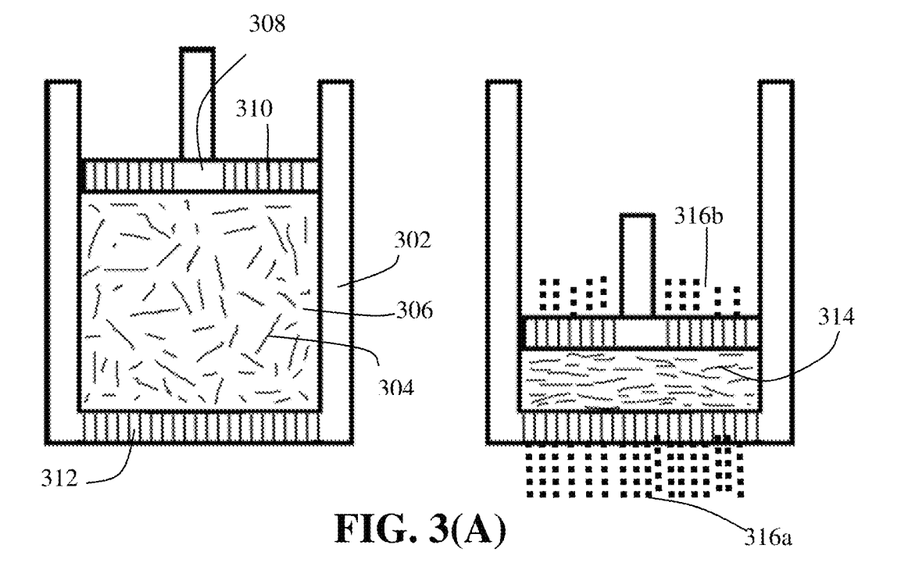
FIG. 3(A) Schematic drawing to illustrate an example of a compressing and consolidating operation (using a mold cavity cell equipped with a piston or ram) for forming a layer of highly oriented graphene sheets, which are aligned parallel to the bottom plane or perpendicular to the layer thickness direction.
Figure 3B:
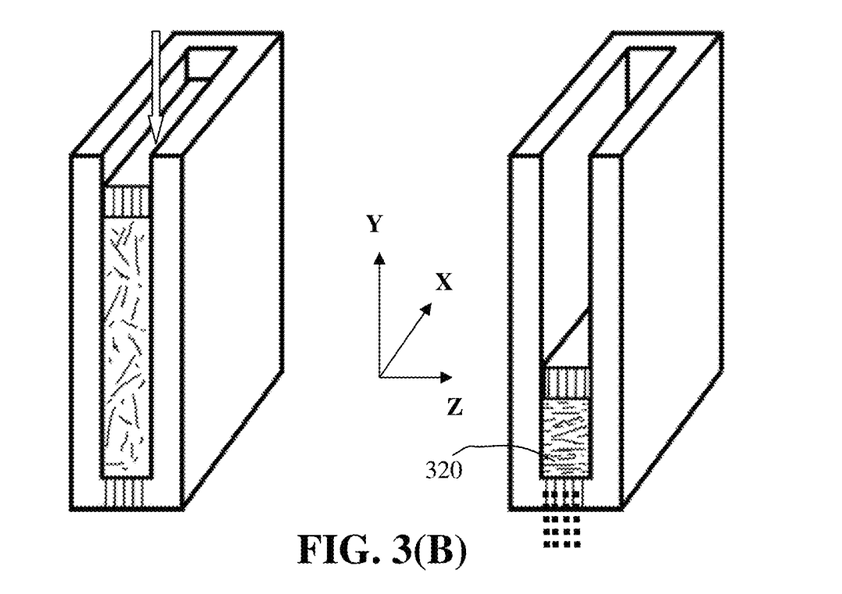
FIG. 3(B) Schematic drawing to illustrate another example of a compressing and consolidating operation (using a mold cavity cell equipped with a piston or ram) for forming a layer of highly oriented graphene sheets, which are aligned perpendicular to the side plane (X-Y plane) or parallel to the layer thickness direction (Z direction).
Figure 3C:
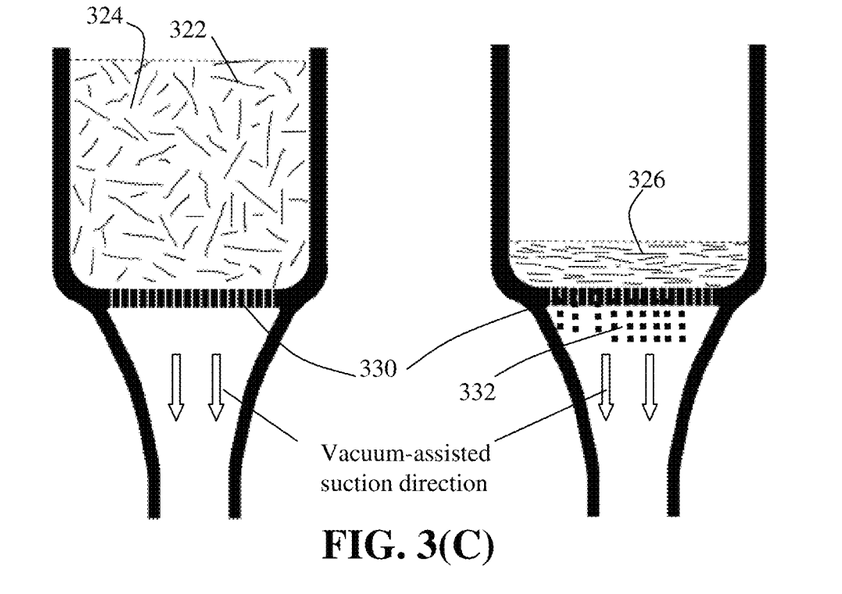
FIG. 3(C) Schematic drawing to illustrate yet another example of a compressing and consolidating operation (using a mold cavity cell with a vacuum-assisted suction provision) for forming a layer of highly oriented graphene sheets, which are aligned parallel to the bottom plane or perpendicular to the layer thickness direction.
Figure 3D:
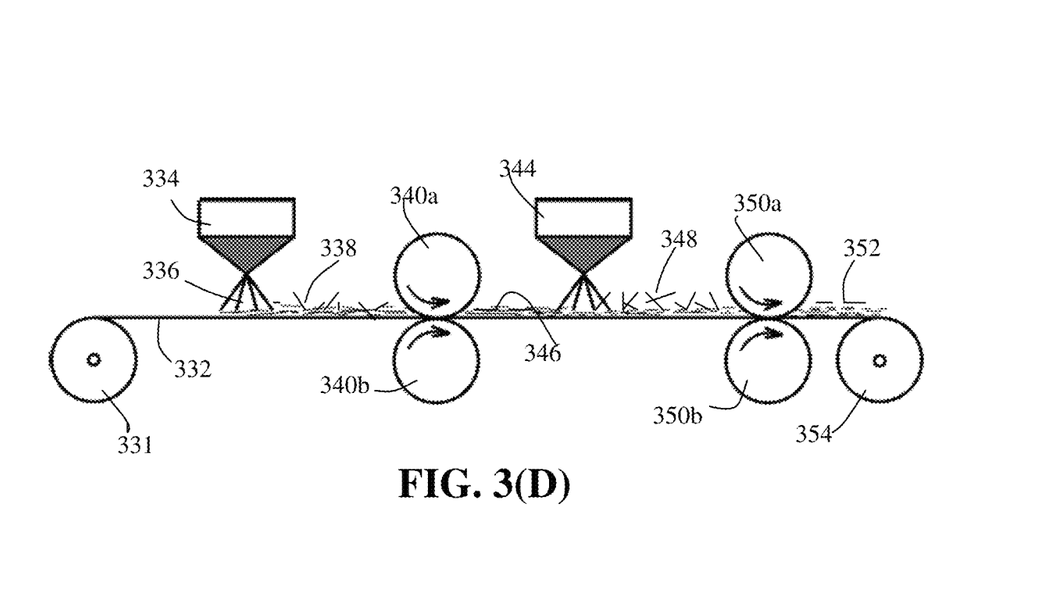
FIG. 3(D) A roll-to-roll process for producing a layer of graphene sheets that are well-aligned on the supporting substrate plane.

In some embodiments, the procedure of forming a layer of an aggregate or cluster of multiple oriented/aligned graphene sheets comprises a procedure selected from air-assisted or liquid-assisted spraying of multiple graphene sheets (e.g. as illustrated in FIG. 3(D)).

In some embodiments, procedure (a) of providing a layer of an aggregate or cluster of multiple graphene sheets comprises a procedure selected from coating, casting, air-assisted clustering, liquid assisted clustering, spraying, printing, or a combination thereof. The coating procedure may be selected from vapor deposition, chemical coating, electrochemical coating or plating, spray-coating, painting, brushing, roll-to-roll coating, physical coating, or a combination thereof.

In certain embodiments, the procedure of forming a layer of an aggregate or cluster of multiple oriented/aligned graphene sheets comprises forming a graphene dispersion containing multiple graphene sheets dispersed in a liquid medium, followed by a procedure, using such a dispersion, selected from coating, casting, spraying, printing, forced assembling and orienting procedure, or a combination thereof. Such a procedure typically involves removal of the liquid medium.

Preferably, the coating procedure includes a roll-to-roll coating process selected from air knife coating, Anilox coating, Flexo coating, gap coating or knife-over-roll coating, gravure coating, hot melt coating, immersion dip coating, kiss coating, metering rod or Meyer bar coating, roller coating, silk screen coating or rotary screen coating, slot-die coating, comma coating, extrusion coating, inkjet printing, or a combination thereof. A pair of counter-rotating rollers may be used to roll-press the aggregate or cluster of graphene sheets, helping to align/orient the graphene sheets to become parallel to each other. Coating processes are well-known in the art.

In some preferred embodiments, the process further comprises a procedure for heat-treating the layer of an aggregate or cluster of multiple graphene sheets, after step (a), at a temperature or multiple different temperatures selected from 50° C. to 3,200° C. For instance, the layer of aggregate of oriented graphene sheets (e.g. graphene oxide sheets or graphene fluoride sheets) may be heat-treated first at a temperature selected from 300° C. to 1,500° C. for 1-3 hours and then at a temperature selected from 2,500° C. to 3,400° C. for 0.5-2 hours.

A precursor to the rubber/elastomer (e.g. liquid monomer/curing agent mixture, oligomers, or uncured resin dissolved in a solvent, etc.) may be dispensed and deposited onto the surface(s) of the layer of graphene sheets after the heat treatment, or somehow impregnated or infiltrated into the pores of the layer of graphene cluster.

After the heat treatment procedure (prior to or after rubber/elastomer impregnation), the resulting aggregate of graphene sheets may be subjected to further compression (e.g. roll-pressing) to align/orient the graphene sheets to become parallel to each other.

In certain embodiments, the process comprises: (A) providing a layer of an aggregate or cluster of multiple graphene sheets; and (B) impregnating an elastomer or rubber into the aggregate or cluster as a binder material or as a matrix material to produce an impregnated aggregate or cluster, wherein the multiple graphene sheets are bonded by the binder material or dispersed in the matrix material and the elastomer or rubber is in an amount from 0.001% to 20% by weight based on the total heat spreader film weight, wherein the elastic heat spreader film has a fully recoverable tensile elastic strain from 2% to 100% and an in-plane thermal conductivity from 200 W/mK to 1,750 W/mK.

The process may further comprise a step (C) of compressing the impregnated aggregate or cluster to produce the heat spreader film, wherein the multiple graphene sheets are substantially aligned to be parallel to one another.

In step (a), alignment of graphene sheets can be achieved through a forced assembly approach that is schematically illustrated in FIG. 3(A), FIG. 3(B), FIG. 3(C), and FIG. 3(D).

In some desired embodiments, the forced assembly procedure includes introducing a dispersion of graphene sheets (also referred to as a graphene dispersion), having an initial volume $V_1$, in a mold cavity cell and driving a piston into the mold cavity cell to reduce the graphene dispersion volume to a smaller value $V_2$, allowing most of the remaining dispersion liquid to flow out of the cavity cell (e.g. through holes of the mold cavity cell or of the piston) and aligning the multiple graphene sheets along a direction at an angle from 0° to 90° relative to a movement direction of said piston.

FIG. 3(A) provides a schematic drawing to illustrate an example of a compressing and consolidating operation (using a mold cavity cell 302 equipped with a piston or ram 308) for forming a layer of highly compacted and oriented graphene sheets 314. Contained in the chamber (mold cavity cell 302) is a dispersion (e.g. suspension or slurry that is composed of graphene sheets 304 randomly dispersed in a liquid 306, optional containing a rubber/elastomer precursor). As the piston 308 is driven downward, the volume of the dispersion is decreased by forcing liquid to flow through minute channels 312 on a mold wall or through small channels 310 of the piston. These small channels can be present in any or all walls of the mold cavity and the channel sizes can be designed to permit permeation of the liquid, but not the solid graphene sheets (typically 0.05-100 μm in length or width). The liquid is shown as 316a and 316b on the right diagram of FIG. 3(A). As a result of this compressing and consolidating operation, graphene sheets 314 are aligned parallel to the bottom plane or perpendicular to the layer thickness direction.

Shown in FIG. 3(B) is a schematic drawing to illustrate another example of a compressing and consolidating operation (using a mold cavity cell equipped with a piston or ram) for forming a layer of highly oriented graphene sheets 320. The piston is driven downward along the Y-direction. The graphene sheets are aligned on the X-Z plane and perpendicular to X-Y plane (along the Z- or thickness direction). This layer of oriented graphene sheets can be attached to a supporting substrate that is basically represented by the X-Y plane. In the resulting electrode, graphene sheets are aligned perpendicular to the substrate. The uncured rubber or elastomer may be incorporated before or after the compressing and consolidating operation.

FIG. 3(C) provides a schematic drawing to illustrate yet another example of a compressing and consolidating operation (using a mold cavity cell with a vacuum-assisted suction provision) for forming a layer of highly oriented graphene sheets 326. The process begins with dispersing isolated graphene sheets 322 and an optional elastomer/rubber or its precursor in a liquid 324 to form a dispersion. This is followed by generating a negative pressure via a vacuum system that sucks liquid 332 through channels 330. This compressing and consolidating operation acts to reduce the dispersion volume and align all the isolated graphene sheets on the bottom plane of a mold cavity cell. Compacted graphene sheets are aligned parallel to the bottom plane or perpendicular to the layer thickness direction. Preferably, the resulting layer of graphene sheet structure is further compressed to achieve an even high tap density. The uncured rubber or elastomer may be incorporated before or after the compressing and consolidating operation Thus, in some desired embodiments, the forced assembly procedure includes introducing a dispersion of graphene sheets in a mold cavity cell having an initial volume $V_1$, and applying a suction pressure through a porous wall of the mold cavity to reduce the dispersion volume to a smaller value $V_2$, allowing liquid to flow out of the cavity cell through the porous wall and aligning the multiple graphene sheets along a direction at an angle from approximately 0° to approximately 90° relative to a suction pressure direction; this angle depending upon the inclination of the bottom plane with respect to the suction direction.

FIG. 3(D) shows a roll-to-roll process for producing a thick layer of heat spreader containing aligned graphene sheets and an elastomer or rubber. This process begins by feeding a continuous solid substrate 332 (e.g. PET film or stainless steel sheet) from a feeder roller 331. A dispenser 334 is operated to dispense a dispersion 336 containing isolated graphene sheets and an optional elastomer/rubber resin precursor onto the substrate surface to form a layer of deposited dispersion 338, which feeds through the gap between two compressing rollers, 340a and 340b, to form a layer of highly oriented graphene sheets. The graphene sheets are well-aligned on the supporting substrate plane. If so desired, a second dispenser 344 is then operated to dispense another layer of dispersion 348 on the surface of the previously consolidated dispersion layer. The two-layer structure is then driven to pass through the gap between two roll-pressing rollers 350a and 350b to form a thicker layer 352 of graphene sheets, which is taken up by a winding roller 354. A precursor to the rubber/elastomer may be sprayed over graphene sheets during any juncture of time during the process.

Thus, in some preferred embodiments, the forced assembly procedure includes introducing a first layer of the graphene sheets dispersion (with or without a rubber/elastomer resin) onto a surface of a supporting conveyor and driving the layer of graphene sheets suspension supported on the conveyor through at least a pair of pressing rollers to reduce the thickness of the graphene sheets dispersion layer and align the multiple graphene sheets along a direction parallel to the conveyor surface for forming a layer of graphene sheets.

The process may further include a step of introducing a second layer of the graphene sheets dispersion (with or without a rubber/elastomer resin) onto a surface of the layer of graphene sheets structure (with or without a rubber/elastomer resin) to form a two layer structure, and driving the two-layer structure through at least a pair of pressing rollers to reduce a thickness of the second layer of graphene sheets and align the multiple graphene sheets along a direction parallel to the conveyor surface for forming a layer of oriented graphene sheets. The same procedure may be repeated by allowing the conveyor to move toward a third set of pressing rollers, depositing additional (third) layer of graphene sheet dispersion onto the two-layer structure, and forcing the resulting 3-layer structure to go through the gap between the two rollers in the third set to form a further aligned and compacted structure of graphene sheets. Again, the elastomer/rubber resin or its precursor may be added during any stage of this process.

The above paragraphs about FIG. 3(A)-FIG. 3(D) are but four of the many examples of possible apparatus or processes that can be used to produce thermal film structures that contain highly oriented and closely packed graphene sheets that are bonded by or dispersed in a rubber/elastomer.

The following examples are used to illustrate some specific details about the best modes of practicing the instant disclosure and should not be construed as limiting the scope of the disclosure. The tensile properties, thermal conductivity, and electrical conductivity of the films were measured by following well-known standard procedures.

Example 1: Graphene Oxide from Sulfuric Acid Intercalation and Exfoliation of MCMBs MCMB (meso-carbon microbeads) were supplied by China Steel Chemical Co. This material has a density of about 2.24 g/cm$^3$ with a median particle size of about 16 µm. MCMBs (10 grams) were intercalated with an acid solution (sulfuric acid, nitric acid, and potassium permanganate at a ratio of 4:1:0.05) for 48 hours. Upon completion of the reaction, the mixture was poured into deionized water and filtered. The intercalated MCMBs were repeatedly washed in a 5% solution of HCl to remove most of the sulfate ions. The sample was then washed repeatedly with deionized water until the pH of the filtrate was neutral. The slurry was dried and stored in a vacuum oven at 60° C. for 24 hours. The dried powder sample was placed in a quartz tube and inserted into a horizontal tube furnace pre-set at a desired temperature, 800° C.-1,100° C. for 30-90 seconds to obtain reduced graphene oxide (RGO) sheets. A quantity of graphene sheets was mixed with water and ultrasonicated at 60-W power for 10 minutes to obtain a graphene dispersion.

A small amount was sampled out, dried, and investigated with TEM, which indicated that most of the NGPs were between 1 and 10 layers. The oxygen content of the graphene powders (GO or RGO) produced was from 0.1% to approximately 25%, depending upon the exfoliation temperature and time.

Several graphene dispersions were separately added with a variety of elastomer precursor resins (e.g. urethane/urea copolymer-based) for use in the slot-die coating procedure of depositing graphene on polymer films. On a separate basis, a graphene dispersion containing no elastomer resin was made into thin films, having a thickness of 10-100 µm. Upon drying, the resulting thin films of reduced graphene oxide (RGO) were spray-deposited with the elastomer precursor resins from both sides (onto the two primary surfaces of a RGO film) and cured subsequently.

Figure 4A:
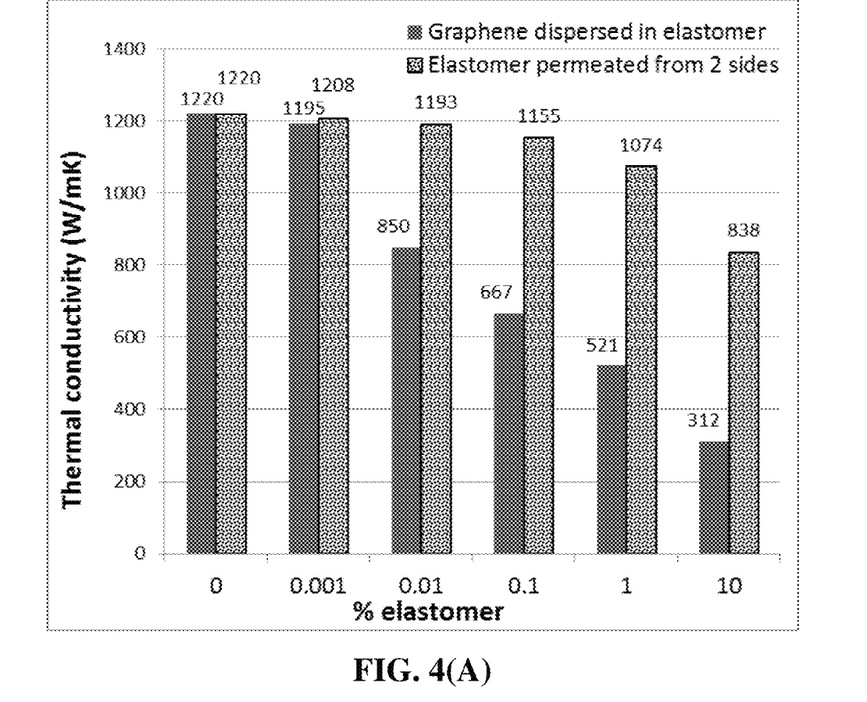
FIG. 4(A) Thermal conductivity values over weight percentage of elastomer for two series of heat spreader films: one series containing graphene sheets uniformly mixed with and dispersed in elastomer resin and the other series containing elastomer resin permeated from two sides of the graphene films.

FIG. 4(A) shows the thermal conductivity values plotted over a wide weight percentage range (0.001%-10%) of an elastomer for two series of heat spreader films: one series containing graphene sheets uniformly mixed with and dispersed in an elastomer and the other series containing elastomer resin permeated into the graphene film from two sides of the film. As one can see, an increase in the elastomer proportion leads to a rapid degradation in the thermal conductivity of a composite containing graphene sheets dispersed in an elastomer matrix. However, a relatively small reduction in thermal conductivity with increasing elastomer proportion is observed for those thermal films having their elastomer resin impregnated inward from the two primary surfaces of a film; impregnation occurs after the film is made. This unexpected result is significant and has a great utility value considering the notion that this strategy enables us to achieve a high thermal conductivity yet also maintaining a high resistance to bending-induced thermal conductivity loss owing to elastomer impregnation (FIG. 4(B)).

This strategy typically leads to a heat spreader structure having an elastomer-free core; the elastomer permeates only a limited distance from the two primary surfaces, not reaching the center by design. One can also find a way to allow for complete permeation of the graphene film by an elastomer resin; e.g. by forming a porous film first, followed by impregnation and full compaction. An elastic heat spreader film has a thickness t, and two primary surfaces (referred to as a front surface and a back surface). In the examples investigated, typically the elastomer or rubber is able to penetrate to a zone away from the front surface at least by a distance ⅓ t and/or to a zone away from the back surface at least by a distance ⅓ t deep into the film.

Figure 4B:
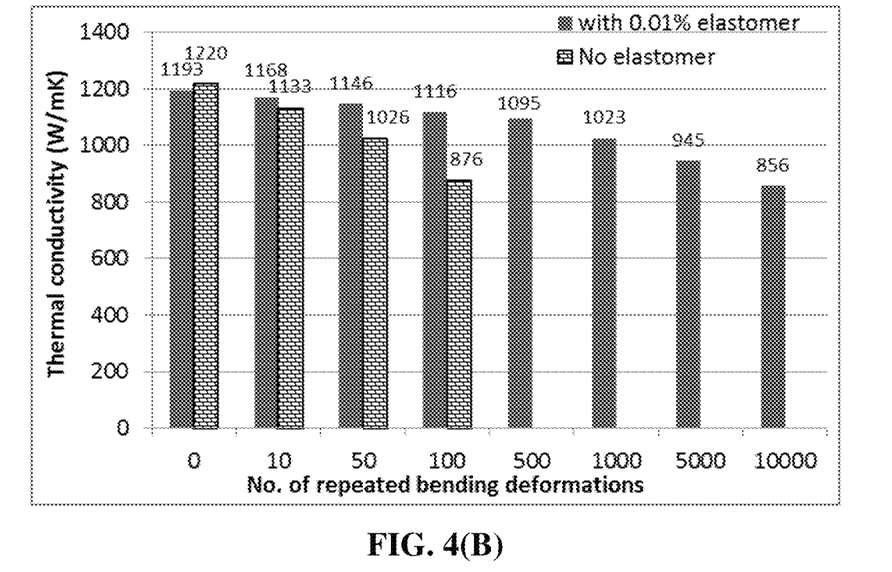
FIG. 4(B) Thermal conductivity plotted as a function of the number of repeated being deformations for two series of thermal films: one is elastomer-free and the other containing surface-impregnated elastomer (0.01% by weight).

Shown in FIG. 4(B) are the thermal conductivity values plotted as a function of the number of repeated bending deformations for two series of thermal films: one is elastomer-free and the other containing surface-impregnated elastomer (0.01% by weight). The sample containing no elastomer exhibits a drop in thermal conductivity from 1220 W/mK to 876 W/mk after 100 bending deformations, each by 180 degrees. The sheet was broken after 110 cycles of bending. In contrast, a small amount of elastomer incorporated into the heat spreader films can withstand 10,000 times of repeated bending without breaking and still maintains a relatively high thermal conductivity.

Figure 4C:
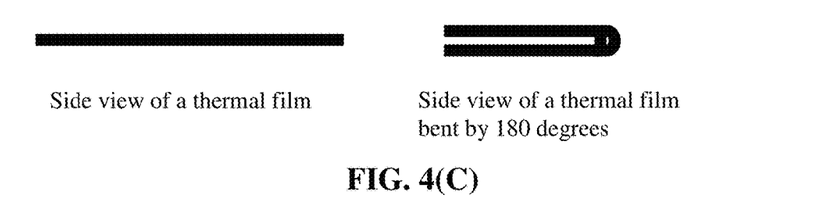
FIG. 4(C) shows a simplified illustration of a bending test.

Bending test is easy to perform, as illustrated in FIG. 4(C). One can take a desired number of identical thermal films and measure thermal conductivity of a specimen prepared by slitting a piece of the film across the bending area, after a desired number of repeated bending deformations, and then measure the thermal conductivity of this piece using the well-known Laser Flash or other method.

Example 2: Oxidation and Exfoliation of Natural Graphite

Graphite oxide was prepared by oxidation of graphite flakes with sulfuric acid, sodium nitrate, and potassium permanganate at a ratio of 4:1:0.05 at 30° C. for 48 hours, according to the method of Hummers [U.S. Pat. No. 2,798,878, Jul. 9, 1957]. Upon completion of the reaction, the mixture was poured into deionized water and filtered. The sample was then washed with 5% HCl solution to remove most of the sulfate ions and residual salt and then repeatedly rinsed with deionized water until the pH of the filtrate was approximately 4. The intent was to remove all sulfuric and nitric acid residue out of graphite interstices. The slurry was dried and stored in a vacuum oven at 60° C. for 24 hours.

The dried, intercalated (oxidized) compound was exfoliated by placing the sample in a quartz tube that was inserted into a horizontal tube furnace pre-set at 650° C. to obtain highly exfoliated graphite. The exfoliated graphite was dispersed in water along with a 1% surfactant at 45° C. in a flat-bottomed flask and the resulting suspension was subjected to ultrasonication for a period of 15 minutes to obtain dispersion of graphene oxide (GO) sheets.

The dispersion was then coated onto a PET film using a reverse-roll coating procedure to obtain GO films. Upon peeling from PET substrate, the GO films were then placed in a graphite mold and subjected to various heat treatments, having a final heat treatment temperature from 25° C. to 2,900° C. After heat treatments, the films were sprayed with some rubber solution (e.g. polyisoprene in THF), which was then dried to remove the solvent. The rubber-impregnated films were then roll-pressed with the rubber cured.

Figure 5:
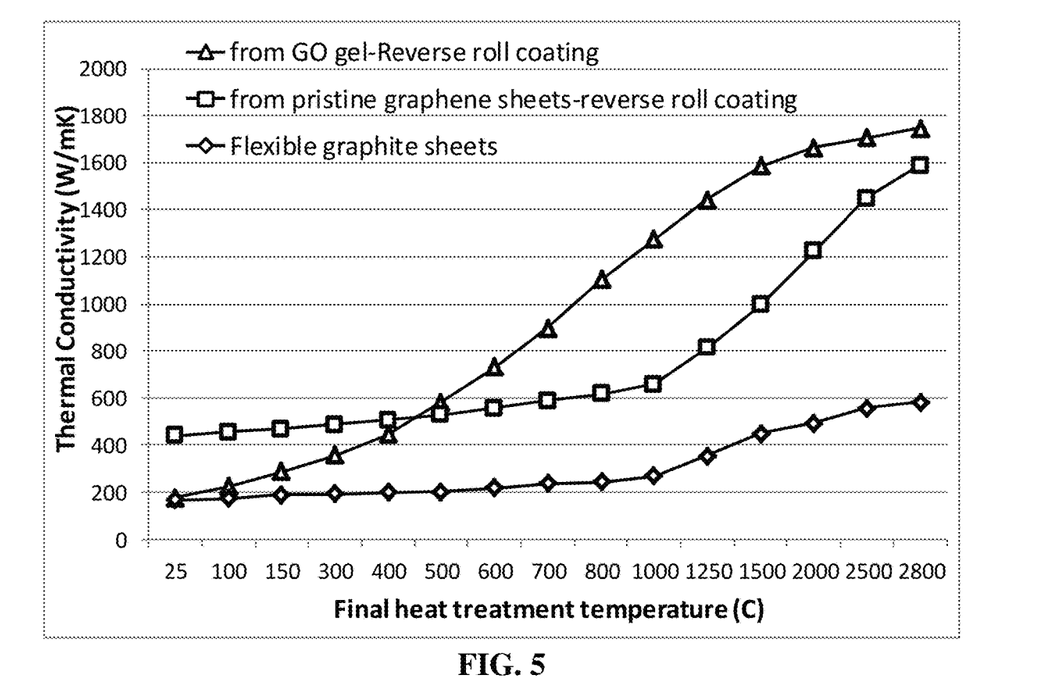
FIG. 5 Thermal conductivity values of graphene-based heat spreader films plotted as a function of the final heat treatment temperature.

The thermal conductivity values of graphene/rubber films, along with those of flexible graphite sheets, are plotted as a function of the final heat treatment temperatures in FIG. 5. This chart indicates the significance of final heat treatment temperatures on the thermal conductivity of various heat spreader films.

Example 3: Preparation of Pristine Graphene

Pristine graphene sheets were produced by using the direct ultrasonication or liquid-phase exfoliation process. In a typical procedure, five grams of graphite flakes, ground to approximately 20 μm in sizes, were dispersed in 1,000 mL of deionized water (containing 0.1% by weight of a dispersing agent, Zonyl® FSO from DuPont) to obtain a suspension. An ultrasonic energy level of 85 W (Branson S450 Ultrasonicator) was used for exfoliation, separation, and size reduction of graphene sheets for a period of 15 minutes to 2 hours. The resulting graphene sheets were pristine graphene that had never been oxidized and were oxygen-free and relatively defect-free. Thermal films were prepared from pristine graphene by following the procedure as described in Example 2. The thermal conductivity values of pristine graphene/rubber films are plotted as a function of the final heat treatment temperatures in FIG. 5.

Examples 4: Preparation of Graphene Fluoride

Several processes have been used by us to produce GF, but only one process is herein described as an example. In a typical procedure, highly exfoliated graphite (HEG) was prepared from intercalated compound $C_2F \cdot xClF_3$. HEG was further fluorinated by vapors of chlorine trifluoride to yield fluorinated highly exfoliated graphite (FHEG). A pre-cooled Teflon reactor was filled with 20-30 mL of liquid pre-cooled $ClF_3$, and then the reactor was closed and cooled to liquid nitrogen temperature. Subsequently, no more than 1 g of HEG was put in a container with holes for $ClF_3$ gas to access the reactor. After 7-10 days, a gray-beige product with approximate formula $C_2F$ was formed. GF sheets were then dispersed in halogenated solvents to form suspensions. The suspensions were then coated on PET film substrate surfaces using comma coating, dried, peeled off from the substrate, and heat treated at 500° C. for 3 hours and 2750° C. for 1 hour. After heat treatments, the films were sprayed with some rubber solution (e.g. ethylene oxide-epichlorohydrin copolymer dissolved in xylene), which was then dried to remove the solvent. The rubber-impregnated films were then roll-pressed with the rubber cured.

Example 5: Preparation of Nitrogenated Graphene

Graphene oxide (GO), synthesized in Example 2, was finely ground with different proportions of urea and the pelletized mixture heated in a microwave reactor (900 W) for 30 s. The product was washed several times with deionized water and vacuum dried. In this method graphene oxide gets simultaneously reduced and doped with nitrogen. The products obtained with graphene/urea mass ratios of 1/0.5, 1/1 and 1/2 are designated as N-1, N-2 and N-3 respectively and the nitrogen contents of these samples were 14.7, 18.2 and 17.5 wt. % respectively as determined by elemental analysis. These nitrogenated graphene sheets remain dispersible in water. The resulting dispersion was subjected to the compressing/aligning procedure as depicted in FIG. 3(A) to form thermal films.

Example 6: Functionalized Graphene-Based Thermal Films

Thermal films were prepared from several functionalized graphene-elastomer dispersions containing 5% by weight of functionalized graphene sheets (few-layer graphene) and 0.01% by weight of urethane oligomer (a mixture of di-isocyanate and polyol). Chemical functional groups involved in this study include an azide compound (2-Azidoethanol), alkyl silane, hydroxyl group, carboxyl group, amine group, sulfonate group (—$SO_3H$), and diethylenetriamine (DETA). These functionalized graphene sheets were supplied from Taiwan Graphene Co., Taipei, Taiwan. Upon casting of the dispersion, removal of the liquid medium (acetone), compressed with a heated press and cured at 150° C. for 45 minutes, one obtained thermal films wherein graphene sheets were well bonded to urethane based elastomer. The presently invented highly oriented graphene-elastomer composite can deliver a thermal conductivity as high as 1,255 W/mK. The fully recoverable tensile deformations (elastic deformation) of this series of elastomer-protected graphene films are found to be typically from 8% to 45%. In contrast, no type of polymer matrix composites has previously exhibited a thermal conductivity higher than 500 W/mK.

We claim:

1. An elastic heat spreader film comprising:
   A) An elastomer or rubber as a binder material or a matrix material; and
   B) multiple graphene sheets that are bonded by said binder material or dispersed in said matrix material, wherein said multiple graphene sheets are substantially aligned to be parallel to one another and wherein said elastomer or rubber is in an amount from 0.001% to 20% by weight based on the total heat spreader film weight and contains a material selected from natural polyisoprene, synthetic polyisoprene, polybutadiene, chloroprene rubber, polychloroprene, butyl rubber, styrene-butadiene rubber, nitrile rubber, ethylene propylene rubber, metailocene-based poly(ethylene-co-octene) elastomer, poly(ethylene-co-butene) elastomer, styrene-ethylene-butadiene-styrene elastomer, epichlorohydrin rubber, polyacrylic rubber, silicone rubber, fluorosilicone rubber, perfluoro-elastomers, polyether block amides, chlorosulfonated polyethylene, ethylene-vinyl acetate, thermoplastic elastomer, protein resilin, protein elastin, ethylene oxide-epichlorohydrin copolymer, polyurethane, urethane-urea copolymer, a sulfonated version thereof, or a combination thereof;
   wherein said multiple graphene sheets contain graphene sheets selected from a pristine graphene material having essentially zero % of non-carbon elements, or a non-pristine graphene material having 0.001% to 25% by weight of non-carbon elements wherein said non-pristine graphene is selected from graphene oxide, reduced graphene oxide, graphene fluoride, graphene chloride, graphene bromide, graphene iodide, hydrogenated graphene, nitrogenated graphene, doped graphene, chemically functionalized graphene, or a combination thereof; and wherein said elastic heat spreader film has a fully recoverable tensile elastic strain from 2% to 100% and an in-plane thermal conductivity from 200 W/mK to 1,750 W/mK;
   wherein said graphene sheets contain a chemical functional group selected from OY, NHY, O=C—OY, P=C—NR'Y, O=C—SY, O=C—Y, —CR'1-OY, N'Y or C'Y, and Y is a functional group of a protein, a peptide, an amino acid, an enzyme, an antibody, a nucleotide, an oligonucleotide, an antigen, or an enzyme substrate, enzyme inhibitor or the transition state analog of an enzyme substrate.

2. The elastic heat spreader film of claim 1, wherein said heat spreader film has a thickness from 5 nm to 500 µm.

3. The elastic heat spreader film of claim 1, wherein said graphene sheets are in an amount from 80% to 99.9% by weight.

4. The elastic heat spreader film of claim 1, wherein said elastic heat spreader film has a thickness t, a front surface, and a back surface, wherein said elastomer or rubber is present in a zone from said front surface to a distance ¼ t deep into said film and/or in a zone from said back surface to a distance ¼ t deep into said film and there is an elastomer-free core.

5. The elastic heat spreader film of claim 1, wherein said elastic heat spreader film has a thickness t and an elastomer-free core size from 1/10 t to 4/5 t.

6. The elastic heat spreader film of claim 1, having a tensile strength no less than 300 MPa, a tensile modulus no less than 75 GPa, a thermal conductivity no less than 500 W/mK, and/or an electrical conductivity no less than 5,000 S/cm, all measured along a thin film plane direction.

7. The elastic heat spreader film of claim 1, having a tensile strength no less than 400 MPa, a tensile modulus no less than 150 GPa, a thermal conductivity no less than 800 W/mK, and/or an electrical conductivity no less than 8,000 S/cm, all measured along a thin film plane direction.

8. The elastic heat spreader film of claim 1, having a tensile strength no less than 500 MPa, a tensile modulus no less than 250 GPa, a thermal conductivity no less than 1,200 W/mK, and/or an electrical conductivity no less than 12,000 S/cm, all measured along a thin film plane direction.

9. The elastic heat spreader film of claim 1, having a tensile strength no less than 600 MPa, a tensile modulus no less than 350 GPa, a thermal conductivity no less than 1,500 W/mK, and/or an electrical conductivity no less than 20,000 S/cm, all measured along a thin film plane direction.

10. The elastic heat spreader film of claim 1, wherein said graphene sheets contain a functional group attached thereto to make the graphene sheets exhibit a negative Zeta potential from −55 mV to −0.1 mV.

11. The elastic heat spreader film of claim 1, wherein said graphene sheets contain a chemical functional group selected from alkyl or aryl silane, alkyl or aralkyl group, hydroxyl group, carboxyl group, epoxide, carbonyl group, amine group, sulfonate group (—$SO_3H$), aldehydic group, quinoidal, fluorocarbon, or a combination thereof.

12. The elastic heat spreader film of claim 1, wherein said graphene sheets contain chemically functionalized graphene sheets having a chemical functional group selected from the group consisting of amidoamines, polyamides, aliphatic amines, modified aliphatic amines, cycloaliphatic amines, aromatic amines, anhydrides, ketimines, diethylenetriamine (DETA), triethylene-tetramine (TETA), tetraethylene-pentamine (TEPA), polyethylene polyamine, polyamine epoxy adduct, phenolic hardener, non-brominated curing agent, non-amine curatives, and combinations thereof.

13. An electronic device containing the elastic heat spreader film of claim 1, as a thermal management element.

14. A structural member containing the elastic heat spreader film of claim 1, as a load-bearing and thermal management element.

* * * * *